US012666980B2

(12) United States Patent
Chen et al.

(10) Patent No.: US 12,666,980 B2
(45) Date of Patent: Jun. 23, 2026

(54) SUBSTRATE STRUCTURE

(71) Applicant: AaltoSemi Inc., Nanjing City (CN)

(72) Inventors: Min-Yao Chen, Nanjing City (CN);
Pei-Ching Li, Nanjing City (CN);
Andrew C. Chang, Nanjing City (CN)

(73) Assignee: AaltoSemi Inc., Nanjing City (CN)

( * ) Notice: Subject to any disclaimer, the term of this
patent is extended or adjusted under 35
U.S.C. 154(b) by 321 days.

(21) Appl. No.: 18/178,187

(22) Filed: Mar. 3, 2023

(65) Prior Publication Data

US 2023/0282556 A1 Sep. 7, 2023

(30) Foreign Application Priority Data

Mar. 4, 2022 (TW) .................................. 111107999

(51) Int. Cl.
| | |
|---|---|
| *H01L 23/14* | (2006.01) |
| *H01L 23/498* | (2006.01) |
| *H10W 70/63* | (2026.01) |
| *H10W 70/69* | (2026.01) |
| *H10W 70/695* | (2026.01) |

(52) U.S. Cl.
CPC ......... *H10W 70/635* (2026.01); *H10W 70/69*
(2026.01); *H10W 70/695* (2026.01)

(58) Field of Classification Search
CPC ............. H01L 23/145; H01L 23/49822; H01L
23/49827; H01L 23/49894; H01L 23/14;
H01L 23/498
USPC ......................................................... 174/264
See application file for complete search history.

(56) References Cited

U.S. PATENT DOCUMENTS

| | | | | |
|---|---|---|---|---|
| 2016/0268326 A1* | 9/2016 | Yu | .......................... | H10F 39/804 |
| 2017/0322434 A1* | 11/2017 | Asakura | ................ | G02F 1/1341 |
| 2018/0240743 A1* | 8/2018 | Lee | .......................... | H10P 72/74 |

FOREIGN PATENT DOCUMENTS

| | | | | | |
|---|---|---|---|---|---|
| CN | 1348204 A | * | 5/2002 | ............. | H01L 21/48 |
| CN | 110767647 A | * | 2/2020 | ............. | H01L 25/16 |

* cited by examiner

*Primary Examiner* — Timothy J Thompson
*Assistant Examiner* — Guillermo J Egoavil
(74) *Attorney, Agent, or Firm* — Dority & Manning, PA

(57) ABSTRACT

A substrate structure is provided, in which an insulator
encapsulates a conductive pillar that is a single solid pillar
body, and at least one wiring layer electrically connected to
the conductive pillar is arranged on the insulator. Therefore,
the conductive pillar is designed as a single solid pillar body
to meet the requirements of thin lines, fine spacing and
high-density contacts.

8 Claims, 2 Drawing Sheets

SUBSTRATE STRUCTURE

CROSS-REFERENCE TO RELATED APPLICATIONS

The present application is based upon and claims the right of priority to Taiwan Patent Application No. 111107999, having a filing date of Mar. 4, 2022, the disclosure of which is hereby incorporated by reference herein in its entirety for all purposes.

BACKGROUND

1. Technical Field

The present disclosure relates to a semiconductor packaging process, and more particularly, to a substrate structure that can meet the requirements of fine lines.

2. Description of Related Art

With the vigorous development of the electronic industry, many high-end electronic products are gradually developing towards light, thin, short, small and other high-density directions. Moreover, with the development of packaging technology, the packaging technology of semiconductor chips is becoming more and more diversified, and the size or volume of the package substrate is also continuously reduced, so as to make the semiconductor package light, thin and compact.

FIG. 1 is a schematic cross-sectional view of a conventional package substrate 1. As shown in FIG. 1, the package substrate 1 includes a core layer 10, circuit structures 11 disposed on both sides of the core layer 10, and solder resist layers 12 disposed on the circuit structures 11, wherein the core layer 10 has conductive pillars 100 penetrating therethrough to electrically connect circuit layers 110 of the circuit structures 11, and each of the circuit structures 11 further includes at least one dielectric layer 111 encapsulating the circuit layers 110. The outermost circuit layer 110 of the circuit structure 11 is exposed from the solder resist layer 12, so as to serve as a contact (i.e., I/O) 112 for connecting a semiconductor chip.

In the manufacturing of the conventional core layer 10, a base material composed of glass fiber and epoxy resin is used, for example dielectric materials such as BT (Bismaleimide Triazine) or FR5, and then a hole-forming step such as mechanical drilling or other methods is performed on the base material to form a through hole. After that, a copper material 100a is electroplated in the through hole, and then an insulating adhesive material 100b is filled to form the conductive pillar 100. In addition, the dielectric layer 111 is made of a material that which does not contain glass fiber.

However, in the conventional package substrate 1, because the conductive pillars 100 are formed by drilling, the aperture w of the through hole must be relatively large under the traditional mechanical drilling technology, resulting in the size of the end surface of the conductive pillars 100 being relatively large. Therefore, the distance between the conductive pillars 100 is relatively large, so that the number of contacts 112 per unit area of the package substrate 1 is small or difficult to increase.

Moreover, under the traditional mechanical drilling technology, the size of the end surface of the conductive pillar 100 must be relatively large, thus occupying the wiring area. Therefore, the line wiring area of the circuit layer 110 on both sides of the conductive pillar 100 is greatly reduced, making it difficult to form the circuit layer 110 with fine line spacing or high-density lines on the package substrate 1. Accordingly, the line spacing of the package substrate 1 is extremely large and the line density is extremely low.

Also, the through hole formed by traditional mechanical drilling needs to have a certain aspect ratio, so that the through hole has a certain depth h. Therefore, when the conductive pillar 100 is produced later, it is difficult to uniformly electroplate the copper material 100a, and it is difficult to fill the insulating adhesive material 100b smoothly, so that voids are likely to occur.

In addition, the conventional core layer 10 is made of a dielectric material containing glass fiber, so that the traditional mechanical drilling is limited by this material and needs to form a through hole with a certain aperture w. Therefore, it is difficult to manufacture the conductive pillar 100 with a small end surface size, and it is difficult to reduce the manufacturing cost of the package substrate 1.

Therefore, how to overcome the shortcomings of the above-mentioned conventional technology has become an urgent problem to be solved at present.

SUMMARY

In view of the various deficiencies of the above-mentioned prior art, the present invention provides a substrate structure comprising: a conductive pillar being a single solid pillar body and having a first end surface and a second end surface opposite to each other; an insulator encapsulating the conductive pillar, wherein the insulator has a first surface and a second surface opposite to each other, so that the first end surface of the conductive pillar is flush with the first surface of the insulator, and the second end surface of the conductive pillar is free from being connected to the second surface; and a wiring layer formed on the first surface and/or the second surface of the insulator to electrically connect the conductive pillar.

In the aforementioned substrate structure, the insulator is a dielectric body without glass fiber.

In the aforementioned substrate structure, the wiring layer is disposed on the first surface of the insulator, and includes at least one circuit portion disposed on the first surface, a conductor disposed on the circuit portion, and a covering portion covering the circuit portion and the conductor. For example, the covering portion is a dielectric body containing glass fiber. Alternatively, the conductor is in a pillar shape. Or, the circuit portion is partially coupled to the first end surface of the conductive pillar.

In the aforementioned substrate structure, the wiring layer is disposed on the second surface of the insulator, and includes at least one conductor disposed on the second surface, a circuit portion disposed on the conductor, and a covering portion covering the circuit portion and the conductor. For example, the covering portion is a dielectric body containing glass fiber. Alternatively, the conductor is in a pillar shape. Or, the circuit portion is partially embedded in the second surface of the insulator to couple to the second end surface of the conductive pillar.

It can be seen from the above that in the substrate structure of the present disclosure, the conductive pillar is designed as a single solid pillar body to meet the requirements of fine line spacing and high-density contacts, and to overcome various shortcomings of the prior art.

DETAILED DESCRIPTIONS

The following describes the implementation of the present disclosure with specific embodiments. Those familiar with the art can easily understand the other advantages and effects of the present disclosure from the content disclosed in this specification.

It should be understood that, the structures, ratios, sizes, and the like in the accompanying drawings are used for reading and understanding of one skilled in the art in conjunction with the contents disclosed in the specification, rather than to limit the conditions for practicing the present disclosure. Any modification of the structure, alteration of the ratio relationship, or adjustment of the size without affecting the effects and proposes of the present disclosure should still fall within the scope compressed by the technical content disclosed in the present disclosure. Meanwhile, terms such as "upper," "first," "second," "one" and the like used herein are merely used for clear explanation rather than limiting practical scope by the present disclosure, and thus, the alteration or adjustment of relative relationship thereof without substantial altering the technical content should be considered within the practical scope of the present disclosure.

Figure 1:
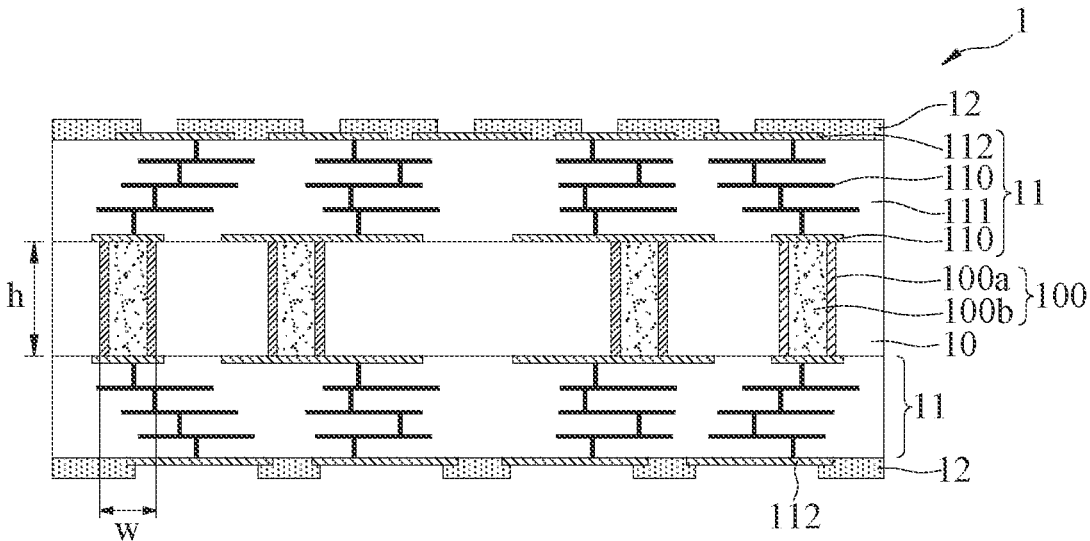
FIG. 1 is a schematic cross-sectional view of a conventional substrate structure.
Figure 2:
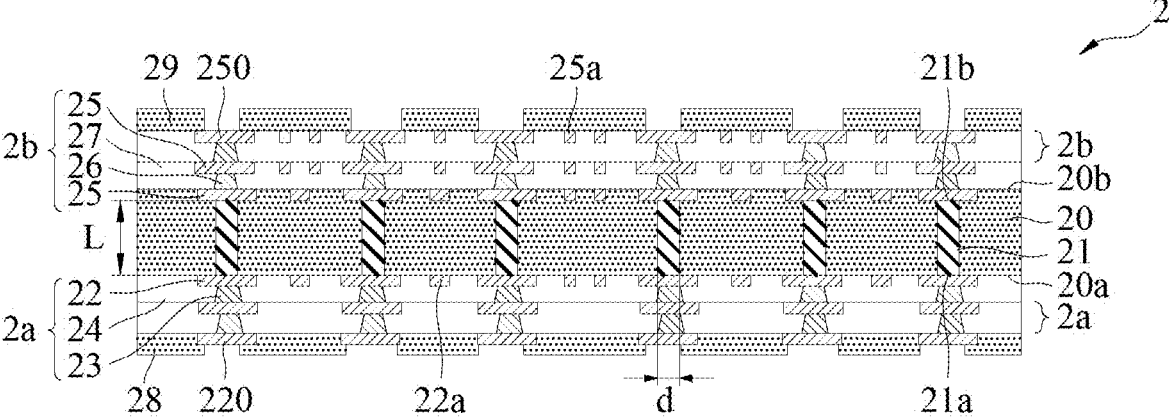
FIG. 2 is a schematic cross-sectional view of a substrate structure according to the present disclosure

FIG. 2 is a schematic cross-sectional view of a substrate structure 2 of the present disclosure. As shown in FIG. 2, the substrate structure 2 includes an insulator 20, at least one conductive pillar 21, and a first wiring layer 2a and a second wiring layer 2b formed on the insulator 20 to electrically connect the conductive pillar 21.

The insulator 20 has a first surface 20a and a second surface 20b opposite to each other and encapsulates the conductive pillar 21.

In this embodiment, the insulator 20 is made of a dielectric material that does not contain glass fiber, and the dielectric material can be epoxy resin (Epoxy). Further, the type of epoxy resin further includes ABF (Ajinomoto Build-up Film), molding compound or primer, such as epoxy molding resin (EMC).

The conductive pillar 21 is a single solid pillar body, which has a first end surface 21a and a second end surface 21b opposite to each other, wherein the first end surface 21a is flush with the first surface 20a of the insulator 20, and the second end surface 21b is not connected to the second surface 20b.

The first wiring layer 2a is disposed on the first surface 20a of the insulator 20, and includes at least one first circuit portion 22 disposed on the first surface 20a, a first conductor 23 on the first circuit portion 22, and a first covering portion 24 covering the first circuit portion 22 and the first conductor 23.

In this embodiment, the first covering portion 24 is made of a dielectric material containing glass fiber, such as prepreg (PP).

Moreover, the first conductor 23 is in a pillar shape, and a part of the first circuit portion 22 is coupled to the first end surface 21a of the conductive pillar 21 to electrically connect the conductive pillar 21.

Also, a solder resist layer 28 may be formed on the outermost side of the first wiring layer 2a, so that the solder resist layer 28 exposes the outermost first circuit portion 22 of the first wiring layer 2a for serving as a contact (i.e., I/O) 220 for connecting to a circuit board.

The second wiring layer 2b is disposed on the second surface 20b of the insulator 20, and includes at least one second conductor 26 disposed on the second surface 20b, a second circuit portion 25 disposed on the second conductor 26, and a second covering portion 27 covering the second circuit portion 25 and the second conductor 26.

In this embodiment, the second covering portion 27 is made of a dielectric material containing glass fiber, such as a prepreg.

Moreover, the second conductor 26 is in a pillar shape, and part of the second circuit portion 25 is embedded in the second surface 20b of the insulator 20 and is flush with the second surface 20b for the conductive pillar 21 to be formed by electroplating on the second circuit portion 25, and the second end surface 21b of the conductive pillar 21 is coupled to the second circuit portion 25 to electrically connect the second circuit portion 25. Specifically, after the second circuit portion 25 is formed on a substrate, the conductive pillar 21 can be formed by electroplating a solid pillar. For example, a patterned resist layer that exposes part of the second circuit portion 25 is formed, and the conductive pillar 21 is formed in the patterned resist layer (not shown) by electroplating, then the patterned resist layer is removed, and then the second circuit portion 25 and the conductive pillar 21 are encapsulated by the insulator 20. Thus, as shown in FIG. 2, the second end surface 21b of the conductive pillar 21 is lower than and not connected to the second surface 20b of the insulator 20.

Also, a solder resist layer 29 may be formed on the outermost side of the second wiring layer 2b, so that the solder resist layer 29 exposes the outermost second circuit portion 25 of the first wiring layer 2b for serving as a contact (i.e., I/O) 250 for connecting a semiconductor chip.

Therefore, in the substrate structure 2 of the present disclosure, because the conductive pillar 21 is manufactured by electroplating a solid pillar, the end surface size (width d of the first end surface 21a or the second end surface 21b) of the conductive pillar 21 can be adjusted according to requirements, so that the distance between the conductive pillars 21 can be effectively reduced, so as to increase the number of contacts per unit area of the substrate structure 2.

Moreover, under the technology of electroplating the solid pillar, the size of the end surface of the conductive pillar 21 can be effectively reduced to reduce the wiring area that occupies the first surface 20a or the second surface 20b, thereby increasing the circuit wiring area of the first and second circuit portions 22, 25 on the first and second end surfaces 21a, 21b (such as conductive traces 22a, 25a of the first and second circuit portions 22, 25). Therefore, compared with the conventional substrate structure, the substrate structure 2 of the present disclosure can easily form the circuit portion with fine line spacing or high-density lines, so that the line spacing of the first and second circuit portions 22, 25 can be greatly reduced and the line density can be greatly increased.

Further, the conductive pillar 21 formed by electroplating the solid pillar is not limited by an aspect ratio. Therefore, the required height L can be formed according to the requirement, and the copper material can be plated uniformly, and there is no need to fill any insulating adhesive in the conductive pillar 21, thus avoiding the occurrence of voids.

In addition, since the insulator 20 covers the conductive pillar 21 with a dielectric material not containing glass fiber, there is no need to make holes, so that the conductive pillar 21 is not be limited by the material of the insulator 20. Therefore, it is beneficial to manufacture the conductive pillar 21 with a small end surface size, and it is beneficial to reduce the manufacturing cost of the substrate structure 2.

To sum up, the substrate structure of the present disclosure is to manufacture the conductive pillar via a single solid pillar body to meet the requirements of thin lines, fine spacing and high-density contacts.

The foregoing embodiments are used for the purpose of illustrating the principles and effects only rather than limiting the present disclosure. Anyone skilled in the art can modify and alter the above embodiments without departing from the spirit and scope of the present disclosure. Therefore, the scope claimed by the present disclosure should be as described by the accompanying claims listed below.

What is claimed is:

1. A substrate structure comprising:

a conductive pillar being a single solid pillar body formed by electroplating and having a first end surface and a second end surface opposite to each other;

an insulator encapsulating the conductive pillar, wherein the insulator has a first surface and a second surface opposite to each other, so that the first end surface of the conductive pillar is flush with the first surface of the insulator, and the second end surface of the conductive pillar is free from being connected to the second surface; and a wiring layer formed on the first surface and/or the second surface of the insulator to electrically connect the conductive pillar, wherein the wiring layer comprises:

a first part of a circuit portion, a second part of the circuit portion, and a conductor disposed on the first surface and/or the second surface of the insulator, wherein the first part of the circuit portion is coupled to the conductive pillar and the conductor, and the second part of the circuit portion is separated from the conductive pillar, the first part of the circuit portion, and the conductor; and a covering portion covering the first part of the circuit portion, the second part of the circuit portion, and the conductor, wherein the covering portion is a dielectric body containing glass fiber.

2. The substrate structure of claim 1, wherein the insulator is a dielectric body without glass fiber.

3. The substrate structure of claim 1, wherein the wiring layer is disposed on the first surface of the insulator, the first part and the second part of the circuit portion are disposed on the first surface, and the conductor is disposed on the first part of the circuit portion.

4. The substrate structure of claim 3, wherein the conductor is in a pillar shape.

5. The substrate structure of claim 3, wherein the first part of the circuit portion is partially coupled to the first end surface of the conductive pillar.

6. The substrate structure of claim 1, wherein the wiring layer is disposed on the second surface of the insulator, the conductor is also disposed on the second surface, and the first part of the circuit portion is disposed on the conductor.

7. The substrate structure of claim 6, wherein the conductor is in a pillar shape.

8. The substrate structure of claim 6, wherein the first part of the circuit portion is partially embedded in the second surface of the insulator to couple to the second end surface of the conductive pillar.

* * * * *